US012790719B2

(12) United States Patent
Lee et al.

(10) Patent No.: US 12,790,719 B2
(45) Date of Patent: *Nov. 10, 2026

(54) CONTINUOUS INGOT GROWTH APPARATUS AND CONTROL METHOD THEREOF

(71) Applicants: HANWHA SOLUTIONS CORPORATION, Seoul (KR); HANWHA CORPORATION, Seoul (KR)

(72) Inventors: Young Jun Lee, Seoul (KR); Kyung Seok Lee, Seoul (KR); Jin Sung Park, Seoul (KR)

(73) Assignees: HANWHA SOLUTIONS CORPORATION, Seoul (KR); HANWHA CORPORATION, Seoul (KR)

( * ) Notice: Subject to any disclaimer, the term of this patent is extended or adjusted under 35 U.S.C. 154(b) by 797 days.

This patent is subject to a terminal disclaimer.

(21) Appl. No.: 18/025,969

(22) PCT Filed: Sep. 3, 2021

(86) PCT No.: PCT/KR2021/011927

§ 371 (c)(1),
(2) Date: Mar. 13, 2023

(87) PCT Pub. No.: WO2022/055183

PCT Pub. Date: Mar. 17, 2022

(65) Prior Publication Data

US 2023/0366123 A1 Nov. 16, 2023

(30) Foreign Application Priority Data

Sep. 14, 2020 (KR) ........................ 10-2020-0117849

(51) Int. Cl.
*C30B 29/06* (2006.01)
*C30B 15/10* (2006.01)
(Continued)

(52) U.S. Cl.
CPC .............. *C30B 29/06* (2013.01); *C30B 15/10* (2013.01); *C30B 15/14* (2013.01); *C30B 15/28* (2013.01); *C30B 15/30* (2013.01)

(58) Field of Classification Search
CPC ....... C30B 15/002; C30B 15/02; C30B 15/10; C30B 15/14; C30B 15/28; C30B 15/30; C30B 29/06
See application file for complete search history.

(56) References Cited

U.S. PATENT DOCUMENTS 5,462,010 A * 10/1995 Takano .................. C30B 15/02 117/214
2007/0062442 A1 3/2007 Cho
(Continued)

FOREIGN PATENT DOCUMENTS

JP 09-175883 A 7/1997
JP 2003-201197 A 7/2003
(Continued)

OTHER PUBLICATIONS

Indian Office Action dated Nov. 4, 2025, issued in Indian application No. 202317027008.
(Continued)

*Primary Examiner* — Hua Qi
(74) *Attorney, Agent, or Firm* — Sughrue Mion, PLLC

(57) ABSTRACT

Disclosed is a continuous ingot growing apparatus. The continuous ingot growing apparatus according to the present invention may include a growth furnace in which a main crucible is positioned, wherein the main crucible accommodates molten-state silicon to grow an ingot, a material supply unit which supplies a solid-state silicon material before being melted into molten-state silicon, a quantitative supply unit which measures an amount of the solid-state silicon material supplied from the material supply unit and supplies
(Continued)

a predetermined amount of the solid-state silicon material, and a preliminary melting unit which melts the predetermined amount of the solid-state silicon material supplied from the quantitative supply unit and supplies molten-state silicon to the main crucible. Since the solid silicon material such as polysilicon is supplied to the main crucible in a state in which the solid silicon material is completely melted outside the main crucible in which the ingot is grown, there is no need to form a partition in the main crucible, and thus the size of the main crucible may be reduced to reduce the manufacturing costs of the apparatus. In addition, since the main crucible is formed as one region, there is an effect of improving the ease of temperature control in the main crucible.

16 Claims, 11 Drawing Sheets

(51) Int. Cl.

| | |
|---|---|
| ***C30B 15/14*** | (2006.01) |
| ***C30B 15/28*** | (2006.01) |
| ***C30B 15/30*** | (2006.01) |

(56) References Cited

U.S. PATENT DOCUMENTS

| | | | | |
|---|---|---|---|---|
| 2015/0233014 | A1 | 8/2015 | Luter et al. | |
| 2017/0171919 | A1* | 6/2017 | Villemin | C21C 5/56 |
| 2018/0066377 | A1* | 3/2018 | Hayashi | C30B 15/04 |

FOREIGN PATENT DOCUMENTS

| | | | | |
|---|---|---|---|---|
| JP | 2009263174 | A * | 11/2009 | F27D 19/00 |
| JP | 2018-039690 | A | 3/2018 | |
| JP | 2020063163 | A * | 4/2020 | |
| WO | 2009/130996 | A1 | 10/2009 | |

OTHER PUBLICATIONS

Office Action issued May 6, 2023 in Chinese Application No. 202011404178.4.

International Search Report for PCT/KR2021/011927 dated Dec. 23, 2021.

* cited by examiner

CONTINUOUS INGOT GROWTH APPARATUS AND CONTROL METHOD THEREOF

CROSS-REFERENCE TO RELATED APPLICATION

This application is a National Stage of International Application No. PCT/KR2021/011927 filed Sep. 3, 2021, claiming priority based on Korean Patent Application No. 10-2020-0117849 filed Sep. 14, 2020.

BACKGROUND

1. Field of the Invention

The present invention relates to a continuous ingot growing apparatus.

2. Discussion of Related Art

Single-crystal silicon is used as a basic material for most semiconductor devices, and such materials are manufactured as single crystals having high purity. One such manufacturing method is the Czochralski method.

In a general ingot growing apparatus based on the Czochralski method, a seed crystal of single-crystal silicon is dipped into an interface of molten silicon contained in a crucible, and then an ingot grows as it is slowly pulled upward.

Among such Czochralski methods, a continuous Czochralski (CCz) method is a method of continuously growing an ingot while replenishing consumed molten silicon in a crucible by continuously injecting solid-state polysilicon into the crucible. That is, an amount of consumed molten silicon is replenished in the crucible during growth of the ingot by continuously supplying polysilicon particles and dopants into the crucible to maintain a constant level of an interface of the molten silicon.

In the CCz method, a partition is generally installed in the crucible to form a double crucible in which an inner crucible and an outer crucible are formed so that the solid-state polysilicon does not stick to the ingot, and after the supplied solid polysilicon is completely melted in the outer crucible, the completely melted polysilicon flows into the inner crucible.

Since the crucible having such a structure includes the partition in one crucible, there are problems that the size of the crucible increases and apparatus manufacturing costs also increase. In addition, since the partition is present in one crucible, it is difficult to control the temperature of each of the inner crucible and the outer crucible, which are formed with the partition interposed therebetween.

SUMMARY OF THE INVENTION

The present invention is directed to providing a continuous ingot growing apparatus capable of continuous ingot growth by directly injecting molten silicon into a crucible and a method of controlling the same.

The present invention is also directed to providing a continuous ingot growing apparatus capable of suppressing a phenomenon in which molten silicon is solidified and fused or stuck while the molten silicon is supplied to a crucible to improve productivity and provide uniform quality of an ingot.

The present invention is also directed to providing a continuous ingot growing apparatus in which a main crucible and a preliminary crucible are divided, miniaturized, and individually heated to reduce energy consumption, wherein an ingot is grown in the main crucible, and a solid-state silicon material, which is a raw material of the ingot, is melted in the preliminary crucible.

The present invention is also directed to providing a continuous ingot growing apparatus using a single structure crucible without a partition in the crucible to further miniaturize the crucible to reduce the manufacturing costs of the apparatus and a hot zone and more easily control a temperature in the crucible.

According to an aspect of the present invention, there is provided a continuous ingot growing apparatus including a growth furnace in which a main crucible is positioned, wherein the main crucible accommodates molten-state silicon to grow an ingot, a material supply unit which supplies a solid-state silicon material before being melted into molten-state silicon, a quantitative supply unit which measures an amount of the solid-state silicon material supplied from the material supply unit and supplies a predetermined amount of the solid-state silicon material, and a preliminary melting unit which melts the predetermined amount of the solid-state silicon material supplied from the quantitative supply unit and supplies molten-state silicon to the main crucible.

The material supply unit may include a material storage housing which stores the solid-state silicon material and a material transfer module which supplies the solid-state silicon material stored in the material storage housing to the quantitative supply unit.

The quantitative supply unit may include a first bucket which accommodates the solid-state silicon material supplied from the material transfer module, a weight detection sensor provided to measure an amount of the solid-state silicon material accommodated in the first bucket, and a quantitative supply housing having an inner space in which the first bucket is positioned, wherein the solid-state silicon material may be blocked from being supplied to the first bucket according to the amount of the solid-state silicon material accommodated in the first bucket.

The continuous ingot growing apparatus may include a second bucket which is positioned in the quantitative supply housing and supplies the solid-state silicon material accommodated in the first bucket to the preliminary melting unit and a transfer module provided in the quantitative supply housing to move the second bucket toward the preliminary melting unit.

Each of the first bucket and the second bucket may be formed in a container shape which is open upward, the first bucket may be positioned above the second bucket, and an operating module, which transfers the solid-state silicon material accommodated in the first bucket to the second bucket, may be coupled to the first bucket.

The operating module may be formed to rotate the first bucket about an axis parallel to a bottom surface.

The operating module may be provided to open and close a lower surface of the first bucket The preliminary melting unit may include a preliminary crucible which accommodates the solid-state silicon material and a preliminary crucible heating module including a body having a heating space in which the preliminary crucible is disposed to be heated and a heater installed in the body to heat the preliminary crucible, wherein one side of the preliminary crucible heating module may be formed to be spatially connected to one side of the quantitative supply housing so that the second bucket transferred by the transfer module enters the heating space.

A blocking plate, which is opened and closed, may be installed between the preliminary crucible heating module and the quantitative supply housing.

An opening may be formed at one side of the preliminary crucible heating module in a direction toward the main crucible.

The continuous ingot growing apparatus may further include a heat insulating member provided on at least any one of an open one side of the heating space and the other side at which the preliminary crucible heating module is spatially connected to the quantitative supply housing in order to block heat in the heating space from leaking.

The preliminary crucible may be formed in a container shape which is open upward, and an open side surface may be formed at one side of the preliminary crucible facing the main crucible. The heating space of the body may form a cross section of a closed curved shape, and a central axis of the heating space may be formed to be tilted with respect to a bottom surface.

In a state in which the second bucket is positioned in the heating space, the preliminary crucible may be positioned under the second bucket.

The continuous ingot growing apparatus may include a preliminary crucible moving module which moves the preliminary crucible in the heating space, wherein the preliminary crucible may be moved between a first position, at which the solid-state silicon material accommodated in the second bucket is accommodated in the preliminary crucible and then melted by the heater, and a second position, at which the molten silicon is supplied to the main crucible, by the preliminary crucible moving module.

At the first position, the preliminary crucible may be tilted so that the open side surface of the preliminary crucible faces upward, at the second position, the preliminary crucible may be tilted so that the open side surface of the preliminary crucible faces downward, and the molten silicon in the preliminary crucible may flow out toward the main crucible in a state in which the preliminary crucible is positioned at the second position.

In a state in which one side of the preliminary crucible is rotatably fixed, the other side of the preliminary crucible may be vertically moved by the preliminary crucible moving module.

According to another aspect of the present invention, there is provided a continuous ingot growing apparatus including a growth furnace in which a main crucible is positioned, wherein the main crucible accommodates molten-state silicon to grow an ingot, a material supply unit which supplies a solid-state silicon material before being melted into molten-state silicon, and a preliminary melting unit including a preliminary crucible which melts the solid-state silicon material supplied from the material supply unit, a body which forms a heating space in which the preliminary crucible is heated, and a preliminary crucible heating module having a heater which heats the preliminary crucible, wherein the molten-state silicon is directly supplied to the main crucible from the preliminary crucible.

An inlet through which the preliminary crucible heating module communicates with the material supply unit may be formed, and a blocking plate which opens and closes the inlet may be provided.

An opening may be formed at one side of the heating space of the preliminary crucible heating module in a direction toward the main crucible.

The preliminary crucible may be formed in a container shape which is open upward, and an open side surface may be formed at one side of the preliminary crucible facing the main crucible.

The heating space of the body may form a cross section of a closed curved shape, and a central axis of the heating space may be formed to be tilted with respect to a bottom surface.

The continuous ingot growing apparatus may include a preliminary crucible moving module which moves the preliminary crucible in the heating space, wherein the preliminary crucible may be moved between a first position, at which the solid silicon material is accommodated in the preliminary crucible and then the solid-state silicon material is melted by the heater, and a second position, at which the molten silicon is supplied to the main crucible, by the preliminary crucible moving module.

At the first position, the preliminary crucible may be tilted so that the open side surface of the preliminary crucible faces upward, at the second position, the preliminary crucible may be tilted so that the open side surface of the preliminary crucible faces downward, and the molten silicon in the preliminary crucible may flow out toward the main crucible in a state in which the preliminary crucible is positioned at the second position.

According to still another aspect of the present invention, there is provided a method of controlling an ingot growing apparatus including a main crucible, a preliminary crucible, and a quantitative supply unit which supplies a solid silicon material to the preliminary crucible, the method including a measurement operation in which an amount of consumed molten silicon is measured by measuring a level of an interface of molten silicon in the main crucible, a silicon material input operation in which an amount of the solid silicon material corresponding to the amount of the consumed molten silicon is supplied to the preliminary crucible, a melting operation in which the solid silicon material is melted using a heater in the preliminary crucible; and a molten silicon replenishment operation in which silicon melted in the preliminary crucible is supplied to the main crucible.

The method may include, before the silicon material input operation in which the solid silicon material is supplied to the preliminary crucible, a quantitative input operation in which the solid silicon material is supplied to the quantitative supply unit, a measuring operation in which whether or not the supplied amount of the solid silicon material is supplied as much as a preset amount is measured, and an operation in which, when the amount of the supplied solid silicon material measured in the measuring operation is suppled as much as the preset amount, supply of the solid silicon material is stopped, and otherwise, the supply of the solid silicon material is continued.

In the measuring operation in which whether or not the amount of the supplied solid silicon material is supplied as much as the preset amount, a first bucket including a weight detection sensor may be used, and in the silicon material input operation in which the solid silicon material is supplied, a second bucket provided in a transfer module which is movable to the preliminary crucible may be used.

In the molten silicon replenishment operation in which the silicon melted in the preliminary crucible is supplied into the main crucible, the molten silicon may flow into the main crucible along a slope of the preliminary crucible.

A high temperature state may be continuously maintained in the preliminary crucible by the heater while the molten silicon flows into the main crucible.

BRIEF DESCRIPTION OF THE DRAWINGS

Not only detailed descriptions of exemplary embodiments of the present invention described below but also the summary described above will be understood more easily when read with reference to the accompanying drawings. The exemplary embodiments are illustrated in the drawings to illustrate the present invention. However, it should be understood that the present invention is not limited to the exact layout and method illustrated in the drawings, in which.

DETAILED DESCRIPTION OF EXEMPLARY EMBODIMENTS

Figure 1:
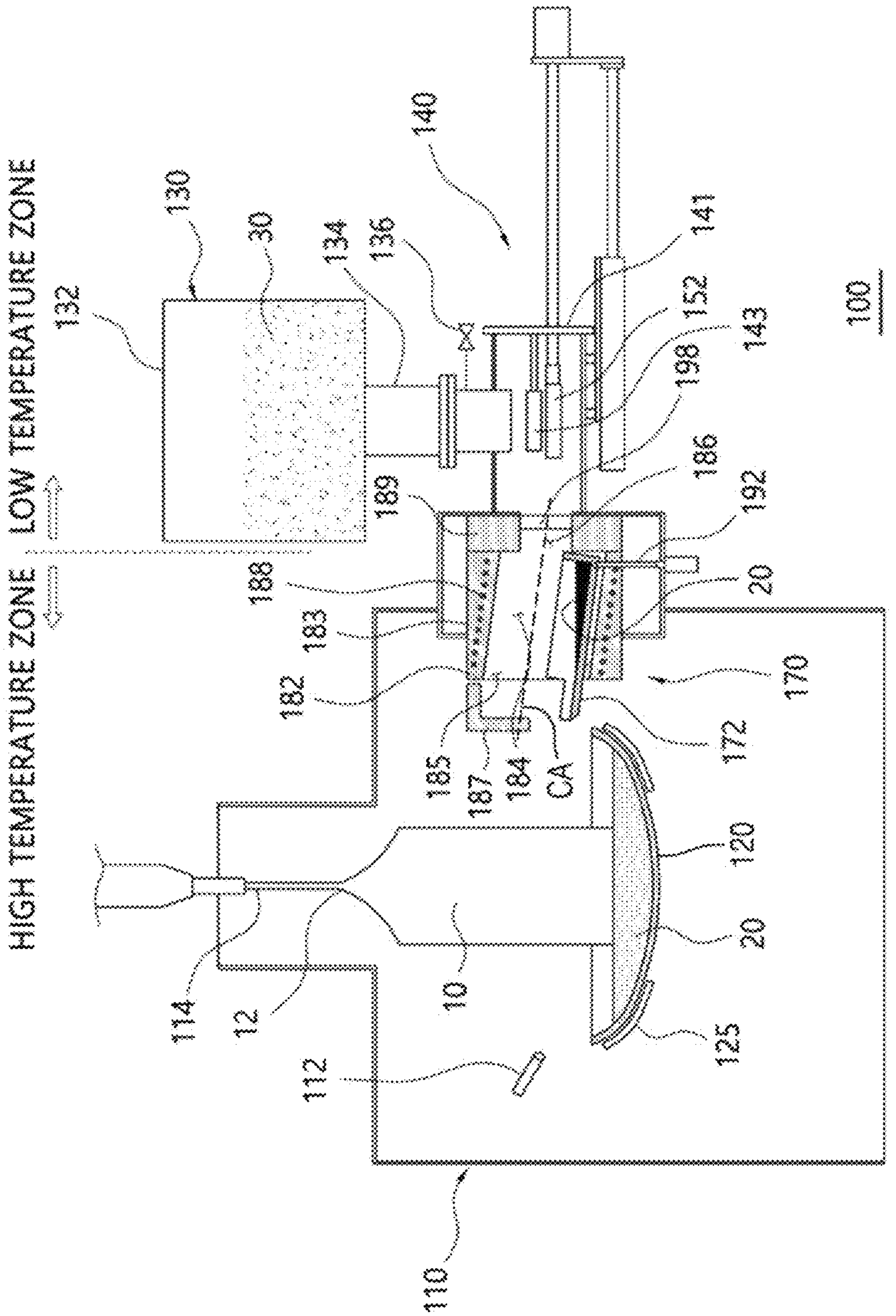
FIG. 1 is a view illustrating a continuous ingot growing apparatus according to one embodiment of the present invention.

Terms and words used in this specification and claims should not be interpreted as limited to commonly used meanings or meanings in dictionaries and should be interpreted with meanings and concepts which are consistent with the technological scope of the present invention based on the principle that the inventors have appropriately defined concepts of terms in order to describe the invention in the best way.

Therefore, since the embodiments described in this specification and configurations illustrated in the drawings are only exemplary embodiments and do not represent the overall technological scope of the invention, the corresponding configurations may have various equivalents and modifications that can substitute for the configurations at the time of filing of this application.

It should be understood that the terms "comprise," "include," or the like, when used herein, specify the presence of stated features, numbers, operations, elements, components, or groups thereof but do not preclude the presence or addition of one or more other features, numbers, operations, elements, components, or groups thereof.

Unless there are special circumstances, a case in which a component is disposed "in front of," "behind," "above," or "under" another component includes not only a case in which the component is disposed directly "in front of," "behind," "above," or "under" another component, but also a case in which still another component is interposed therebetween. Unless there are special circumstances, a case in which some components are connected to each other includes not only a case in which the components are directly connected to each other, but also a case in which the components are indirectly connected to each other.

Hereinafter, a continuous ingot growing apparatus according to one embodiment of the present invention will be described with reference to the accompanying drawings.

Figure 2:
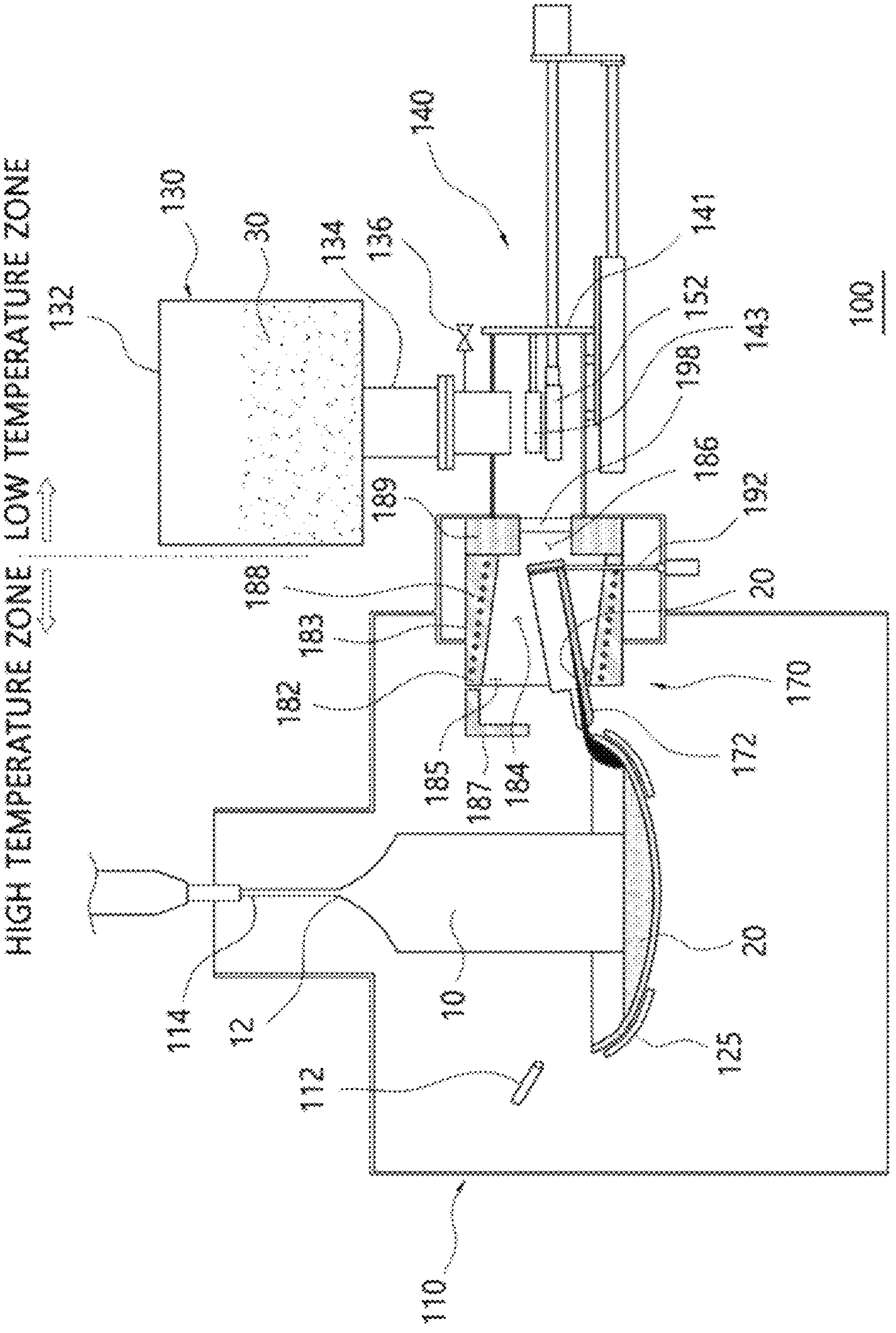
FIG. 2 is a view illustrating a state in which a preliminary crucible is positioned at a second position in the continuous ingot growing apparatus according to one embodiment of the present invention.

As illustrated in FIGS. 1 and 2, a continuous ingot growing apparatus 100 according to the present embodiment may include a growth furnace 110, a main crucible 120, a material supply unit 130, a quantitative supply unit 140, and a preliminary melting unit 170.

The growth furnace 110 may form a space in which an ingot 10 is grown and a space in which the main crucible 120 is installed.

In the main crucible 120, molten silicon 20 to be grown into the ingot 10 may be contained and heated. A heating unit 125 for heating the main crucible 120 and the molten silicon 20 contained in the main crucible 120 may be disposed outside a lower portion of the main crucible 120.

The heating unit 125 may be configured to adjust an oxygen concentration by providing a separate magnetic field to generate circulating convection in the molten silicon 20, and the temperature and magnetic field of the heating unit 125 are constantly maintained according to temperature and magnetic field profiles determined for growth of the ingot 10.

The main crucible 120 may be formed in a container shape having an open upper side, that is, a substantially round shape forming a part of a sphere.

In the main crucible 120, the molten silicon 20 may be grown into the ingot 10, and the grown ingot 10 may be slowly moved upward so that a size and a length of the grown ingot 10 may be increased. A pulling wire 114 and the like for pulling the ingot 10 upward may be provided in the growth furnace 110.

In a state in which the pulling wire 114 moves downward so that a seed 12 at a lower end of the pulling wire 114 is in contact with the molten silicon 20, the pulling wire 114 rotates and moves upward. In this case, the rotational speed and pulling speed of the pulling wire 114 are uniformly maintained according to rotational speed and pulling speed profiles previously determined for an entire process related to the rotational speed and pulling speed. When the pulling wire 114 is moved upward, an upper portion of the ingot 10 inclined downward from the seed 12 is crystallized, and while the upward movement continues, a height of the ingot 10 crystallized after the upper portion of the ingot 10, generally referred to as a shoulder portion, is formed is gradually increased to grow the ingot 10.

In addition, an interface level detection means 112 for detecting the level of an interface of the molten silicon 20 in the main crucible 120 may be provided in the growth furnace 110.

The material supply unit 130 is a component for storing a silicon material 30 such as solid-state polysilicon before it is melted into the molten silicon 20 and is disposed outside the growth furnace 110.

In addition, the quantitative supply unit 140 may be disposed outside the growth furnace 110, receive the solid-state silicon material 30 from the material supply unit 130, and measure an amount of the supplied solid-state silicon material 30.

The silicon material 30 whose amount is measured by the quantitative supply unit 140 may be supplied to the preliminary melting unit 170 which will be described below.

The preliminary melting unit 170 may be provided at one side of the growth furnace 110, receive the solid-state silicon material 30 whose amount is measured by the quantitative supply unit 140, and heat the received silicon material 30 to liquefy the received silicon material 30 into completely molten silicon 20. In addition, the preliminary melting unit 170 may supply the molten silicon 20 to the main crucible 120.

The preliminary melting unit 170 may completely melt the solid-state silicon material 30 received from the quantitative supply unit 140 and then supply the molten silicon 20 to the main crucible 120.

Hereinafter, each of the above components will be described in more detail, and first, the preliminary melting unit 170 will be described.

The preliminary melting unit 170 may include a preliminary crucible 172 which accommodates the solid-state silicon material 30 supplied from the quantitative supply unit 140 and a preliminary crucible module 182 which has a heating space 184 in which the preliminary crucible 172 is disposed and heated.

Accordingly, the solid-state silicon material 30 supplied from the quantitative supply unit 140 may be accommodated in the preliminary crucible 172, and the preliminary crucible 172 may be positioned in the heating space 184 and heated to form the supplied solid-state silicon material 30 into molten-state silicon 20.

In this case, the preliminary crucible module 182 may include a body 183 forming the heating space 184 in which the preliminary crucible 172 is accommodated and a heater 188 which is provided in the body 183 and heats the preliminary crucible 172. The preliminary crucible module 182 may be installed at one side of the growth furnace 110.

In addition, an opening 185 is formed at a side of the heating space 184 facing the main crucible 120 to communicate with the inside of the growth furnace 110, and an inlet 186 communicating with the quantitative supply unit 140 may also be formed.

Accordingly, the quantitative supply unit 140 may enter the heating space 184 of the preliminary crucible module 182 through the inlet 186 and supply the solid-state silicon material 30 to the preliminary crucible 172.

In addition, after the silicon material 30 accommodated in the preliminary crucible 172 is completely melted into the state of molten silicon 20, the preliminary crucible 172 may be tilted to one side to pour and supply the molten silicon 20 to the main crucible 120.

In the present embodiment, in the preliminary melting unit 170, a side facing the main crucible 120 is referred to as one side, and the opposite side is referred to as the other side.

That is, a position of the preliminary crucible 172 may be controlled to be any one position among a first position at which the preliminary crucible 172 accommodates the solid-state silicon material 30 and melts the accommodated silicon material 30 and a second position at which the preliminary crucible 172 is tilted to pour and supply the heated and molten silicon 20 into the main crucible 120. That is, the first position may be a position of the preliminary crucible 172 at which the solid silicon material 30 or the molten silicon 20 accommodated in the preliminary crucible 172 does not overflow or flow to the outside of the preliminary crucible 172, and the second position may be a position of the preliminary crucible 172 at which the molten silicon 20 accommodated in the preliminary crucible 172 flows or pours into the main crucible 120. In this case, the positions may mean not only positions of the preliminary crucible 172 in a horizontal direction and a vertical direction, but also angles of the preliminary crucible 172 with respect to a bottom surface.

To this end, a preliminary crucible moving module 192 for moving a position of the preliminary crucible 172 may be provided in the preliminary melting unit 170. In the embodiment of the present invention, as illustrated in FIGS. 1 and 2, the preliminary crucible moving module 192 may tilt one side of the preliminary crucible 172 facing the main crucible 120 toward the main crucible 120 to pour the molten silicon 20 accommodated in the preliminary crucible 172 into the main crucible 120.

The preliminary crucible 172 may be formed in a container shape having an open upper side. In addition, a side surface of one side of the preliminary crucible 172 facing the main crucible 120 may be formed to be open to form an open side surface 173 so that the molten silicon 20 in the preliminary crucible 172 easily flows to the main crucible 120 when the preliminary crucible 172 is at the second position.

In addition, the open side surface 173 of the preliminary crucible 172 may be tilted upward at the first position so that the silicon material 30 and the molten silicon accommodated in the preliminary crucible 172 do not overflow when the preliminary crucible 172 having one open side is at the first position.

In addition, the open side surface 173 of the preliminary crucible 172 may be inclined downward at the second position so that the molten silicon 20 of the preliminary crucible 172 more efficiently flows into the main crucible 120 when the preliminary crucible 172 is at the second position.

Accordingly, when the preliminary crucible 172 is tilted to the second position, the molten silicon 20 in the preliminary crucible 172 may flow out along a slope, that is, the open side surface 173 of the preliminary crucible 172 and fall into the main crucible 120 due to gravity.

To this end, the preliminary crucible moving module 192 may include a hinge 194 to which one side of the preliminary crucible 172 is fixed to be rotatable with respect to the body 183 and a lifter 196 provided at a position of the other side spaced apart from the hinge 194 to be movable upward and downward to move the other side portion of the preliminary crucible 172 in a vertical direction.

Accordingly, when the lifter 196 moves the other side portion of the preliminary crucible 172 downward, the preliminary crucible 172 is tilted to the first position, and the lifter 196 moves the other side portion of the preliminary crucible 172 upward, the preliminary crucible 172 is tilted to the second position.

In addition, the heating space 184 of the body 183 may be formed in a cylindrical shape, and the heater 188 may be formed to be wound around a circumference of the heating space 184. In the embodiment of the present invention, the heater 188 may be a coil which is heated using the electrical resistance of the heater 188 in a resistance heating manner or a coil using an induction heating method which heats the preliminary crucible 172 in an induction heating manner.

In addition, the preliminary crucible 172 may be formed so that a lower surface of the preliminary crucible 172 is curved to form a part of a cylindrical shape so as to correspond to an inner circumferential surface of the cylindrical heating space 184. However, the entire heating space 184 may be formed in a cylindrical shape.

In addition, when the preliminary crucible 172 is at the first position, a lower surface of the heating space 184 may be also tilted at the same angle as the angle at which the preliminary crucible 172 is tilted at the first position so that the preliminary crucible 172 is tilted at the first position in a state in which the preliminary crucible 172 is seated on the lower surface of the heating space 184. To this end, a central axis CA of the cylindrical heating space 184 may be inclined with respect to the bottom surface on which the continuous ingot growing apparatus 100 according to the embodiment of the present invention is installed.

Meanwhile, as the preliminary crucible 172 is always positioned in the heating space 184 of the preliminary crucible heating module 182 even when preliminary crucible 172 is at the first position or the second position, the preliminary crucible 172 may be provided at a position at which the preliminary crucible 172 is always heated. Accordingly, a phenomenon in which the preliminary crucible 172 is cooled and the molten silicon 20 is fused and solidified in the preliminary crucible 172 can be minimized. In addition, the heater 188 may intermittently or continuously heat the preliminary crucible 172 so that a predetermined temperature or more is maintained in the preliminary crucible 172 so as not to cool the preliminary crucible 172 regardless of whether the preliminary crucible 172 is at the first position or the second position.

Figure 3:
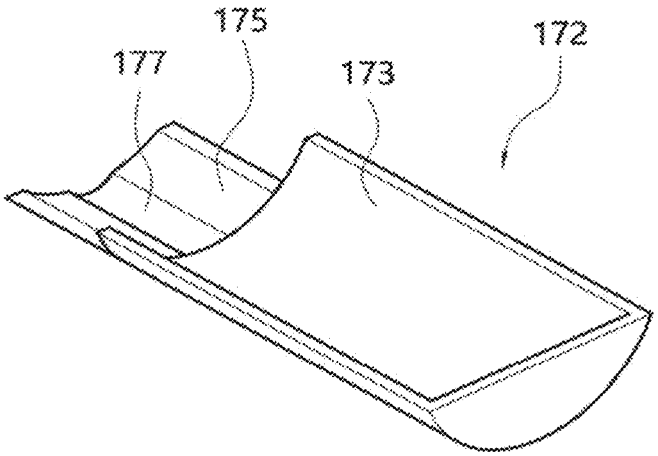
FIG. 3 is a perspective view illustrating the preliminary crucible of the continuous ingot growing apparatus according to one embodiment of the present invention.

Meanwhile, as illustrated in FIG. 3, the preliminary crucible 172 may be formed in a partial cylindrical shape so that an upper portion and one side facing the main crucible 120 are open and further include a snout part 175 extending from the one side facing the main crucible 120.

A shape of the snout part 175 may be determined so that the molten silicon 20 contained in the preliminary crucible 172 does not overflow through the open one side when the preliminary crucible 172 is at the first position and a contact area of the snout part 175 in contact with a mainly heated portion of the preliminary crucible 172 is wide in consideration of heat conduction to easily heat a passage through which the molten silicon 20 is moved. The snout part 175 may extend to one side from the open side surface 173 of the preliminary crucible 172 to guide the molten silicon 20 contained in the preliminary crucible 172 to the main crucible 120 when the preliminary crucible 172 is at the second position.

A gully 177 may be formed on an upper surface of the snout part 175 to guide the molten silicon 20 in the preliminary crucible 172 to the main crucible 120 when the preliminary crucible 172 is at the second position.

The material supply unit 130 may include a material storage housing 132 storing the solid-state silicon material 30 and a material transfer module 134 which transfers the silicon material 30 stored in the material storage housing 132 to the quantitative supply unit 140.

The material transfer module 134 may include a valve 136 or the like capable of applying vibrations to the silicon material 30 to uniformly transfer the solid-state silicon material 30 to the quantitative supply unit 140 and controlling whether or not to input the silicon material 30 to the quantitative supply unit 140.

Figure 4:
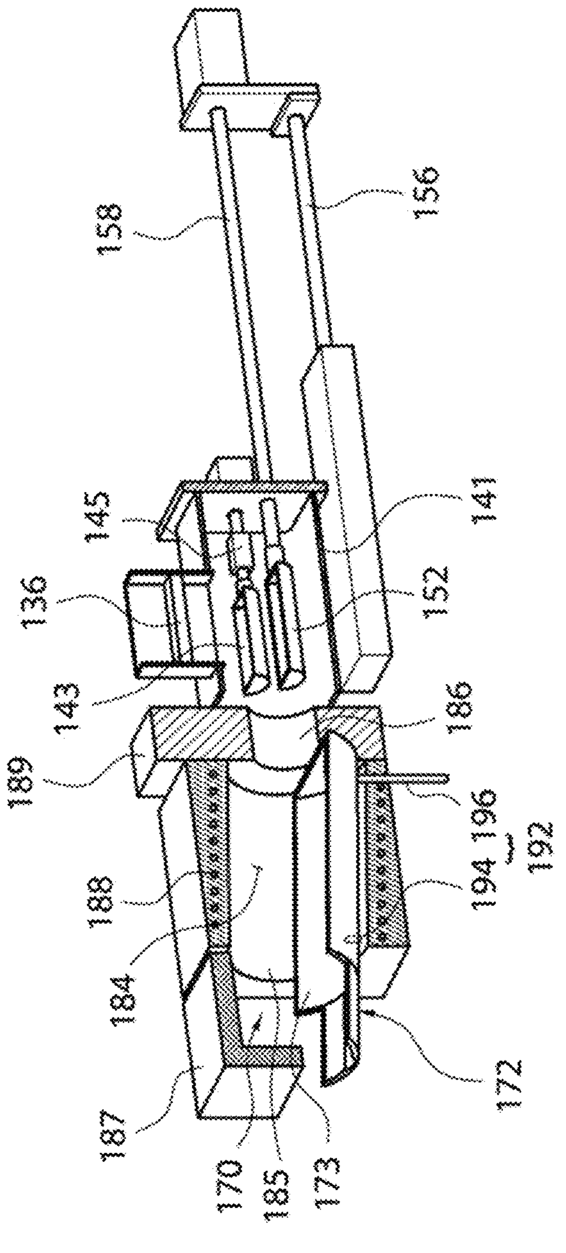
FIG. 4 is a perspective cross-sectional view illustrating a quantitative supply unit of the continuous ingot growing apparatus according to one embodiment of the present invention.
Figure 5:
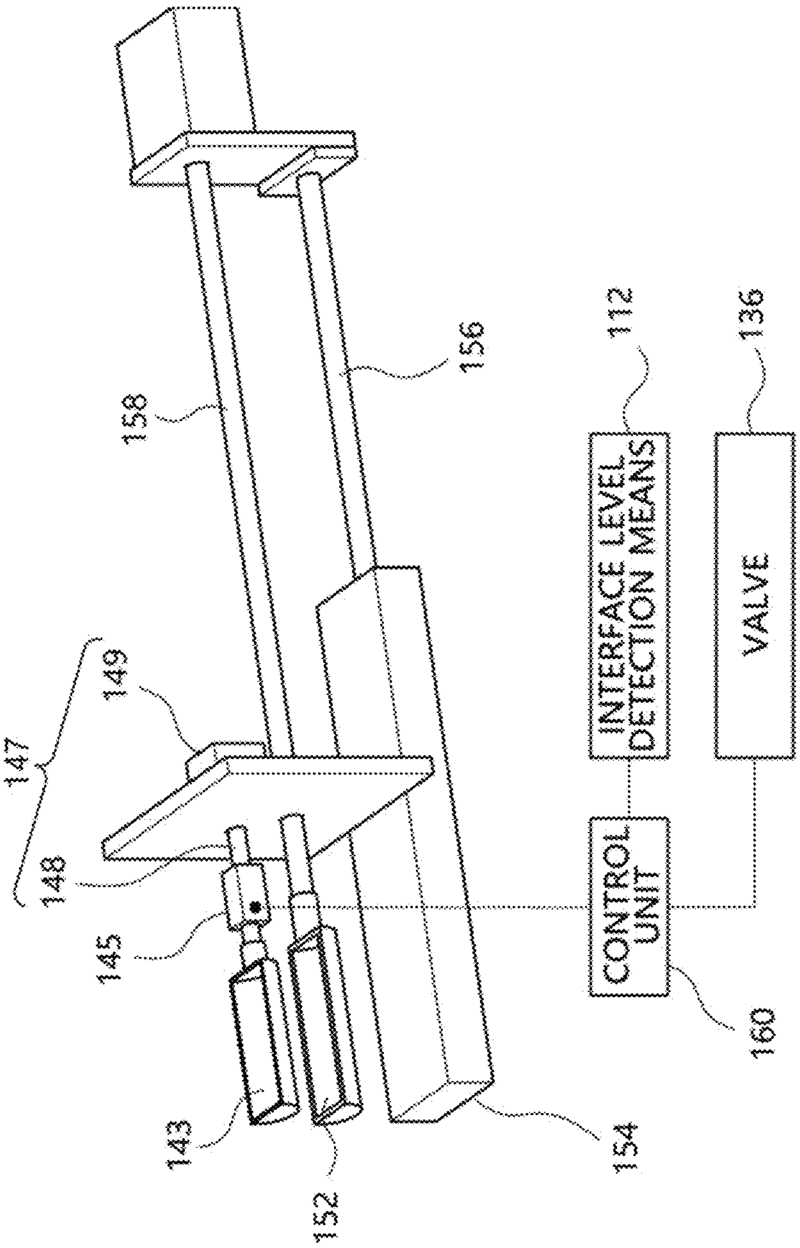
FIG. 5 is a perspective view illustrating a first bucket and an operating module included in the quantitative supply unit of FIG. 4.

Meanwhile, as illustrated in FIGS. 4 and 5, the quantitative supply unit 140 may include a quantitative supply housing 141, a first bucket 143, a weight detection sensor 145, and an operating module 147.

The quantitative supply housing 141 may communicate with the material transfer module 134 and form an inner space in which the first bucket 143, the weight detection sensor 145, and the operating module 147 are accommodated.

The first bucket 143 may be provided at a position to accommodate the solid-state silicon material 30 supplied from the material transfer module 134 in the quantitative supply housing 141. The first bucket 143 may be formed in a container shape of which an upper portion is open to accommodate the solid-state silicon material 30 supplied from the material transfer module 134. The weight detection sensor 145 may be provided to measure an amount of the solid-state silicon material accommodated in the first bucket 143. In this case, the weight detection sensor 145 may measure not only an amount of the silicon material 30 accommodated in the first bucket 143 in a final state, but also an amount of the solid-state silicon material using a separate component and an amount of the solid-state silicon material 30 whose amount has been measured as described above is also measured when supplied to the first bucket 143. The weight detection sensor 145 may be formed of a load cell and the like to measure the above amount by measuring a weight of the silicon material accommodated in the first bucket 143 and by measuring a weight of the solid-state silicon material 30 accommodated in the first bucket 143.

In addition, the quantitative supply unit 140 may include a second bucket 152 and a transfer module 154 which are for transferring the solid-state silicon material 30, whose amount is measured in the first bucket 143, to the preliminary melting unit 170.

In addition, the operating module 147 may be a component provided to transfer the solid-state silicon material 30 accommodated in the first bucket 143 to the second bucket 152.

Figure 6:
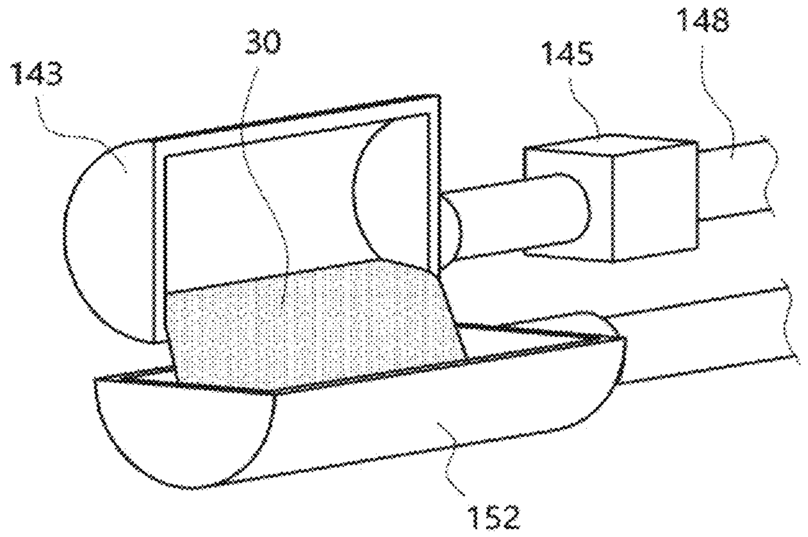
FIG. 6 is a view illustrating a process in which the first bucket of FIG. 5 rotates to transfer a silicon material to a second bucket.

As illustrated in FIG. 6, the first bucket 143 may be positioned above the second bucket 152, and when the weighing of the amount of the silicon material 30 in the first bucket 143 is completed, the first bucket 143 may be rotated and turned upside down, and thus the solid silicon material 30 in the first bucket 143 may be transferred to the second bucket 152 under the first bucket 143.

Accordingly, the operating module 147 may be provided to rotate the first bucket 143 about an axis parallel to the bottom surface. The operating module 147 may include a first rotary shaft 148 installed to be parallel to the bottom surface to rotate the first bucket 143 and a first driving unit 149 which rotates the first rotary shaft 148.

Figure 7:
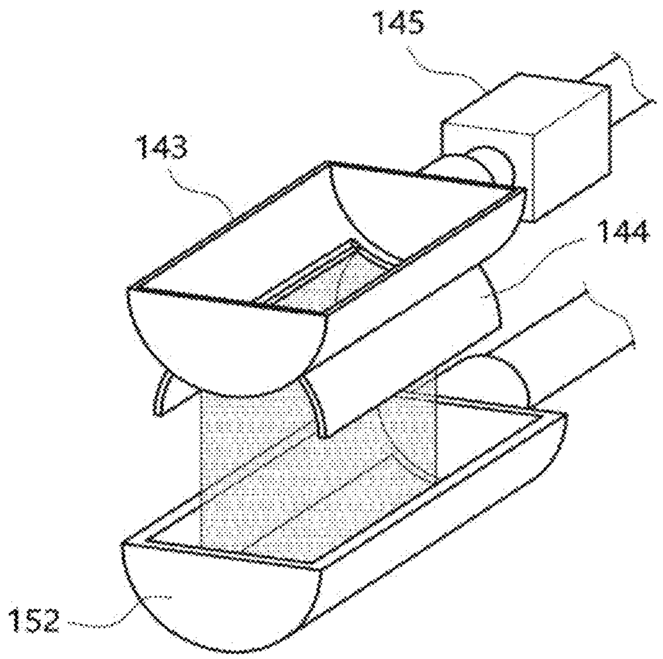
FIG. 7 is a view illustrating a process in which a lower surface of the first bucket of FIG. 5 is opened to transfer the silicon material to the second bucket.

Alternatively, as illustrated in FIG. 7, the operating module 147 may be provided to open and close a lower surface 144 of the first bucket 143. That is, the operating module 147 may rotate the first bucket 143 or open and close the lower surface 144 to transfer the solid silicon material 30 accommodated in the first bucket 143 to the second bucket 152.

In addition, a control unit 160 which controls the interface level detection means 112, the valve 136 of the material transfer module 134, the weight detection sensor 145, and the first driving unit 149 may be provided. The control unit 160 may be provided in the form of a microcomputer or the like at one side of the continuous ingot growing apparatus

100 or in the form of a personal computer (PC) or the like at the outside and connected through a wire or wirelessly.

That is, when the control unit 160 detects that the level of the interface in the main crucible 120 measured by the interface level detection means 112 is lower than a set value, the control unit 160 may open the valve 136 of the material transfer module 134 to supply the solid silicon material 30 to the first bucket 143.

In this case, an amount of the solid-state silicon material 30 accommodated in the first bucket 143 is measured by the weight detection sensor 145 to determine whether a preset amount is supplied, and when the preset amount of the solid-state silicon material 30 is supplied, the valve 136 of the material transfer module 134 may be closed to stop supply of the solid-state silicon material 30.

In addition, after the supply of the solid-state silicon material 30 is stopped, the first driving unit 149 is rotated to turn the first bucket 143 upside down to transfer the solid-state silicon material 30, whose amount is measured, to the second bucket 152 provided under the first bucket 143.

In addition, the first rotary shaft 148 may be eccentrically coupled at a point at which the first bucket 143 is spaced apart from a central axis.

The second bucket 152 may be provided under the first bucket 143 and formed in a container shape of which an upper portion is open to receive the solid silicon material 30 from the first bucket 143 and accommodate the solid silicon material 30. In this case, the second bucket 152 may be formed to have an area and capacity greater than those of the first bucket 143. In addition, the transfer module 154 may be a component which moves the second bucket 152 to transfer the silicon material 30 accommodated in the second bucket 152 to the preliminary melting unit 170 according to control of the control unit.

The transfer module 154 may include a sliding unit 156 and a second rotation unit 158. The sliding unit 156 may be provided to reciprocate the second bucket 152 from the quantitative supply housing 141 into the heating space 184 of the preliminary crucible heating module of the preliminary melting unit. In addition, the second rotation unit 158 may be provided to rotate the second bucket 152 having entered the heating space 184. In this case, the second bucket 152 having entered the heating space 184 may be positioned above the preliminary crucible 172.

Figure 8:
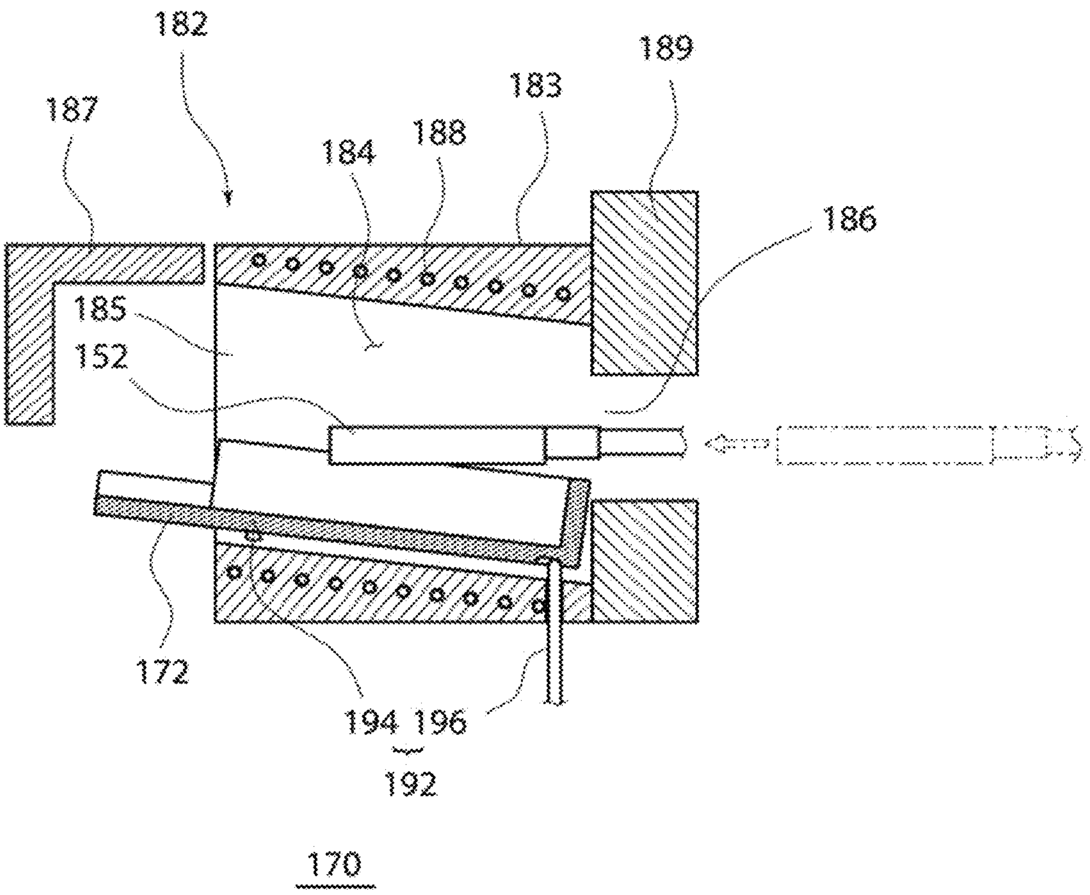
FIG. 8 is a view illustrating a state in which the second bucket enters an upper side of the preliminary crucible of a preliminary melting unit.
Figure 9:
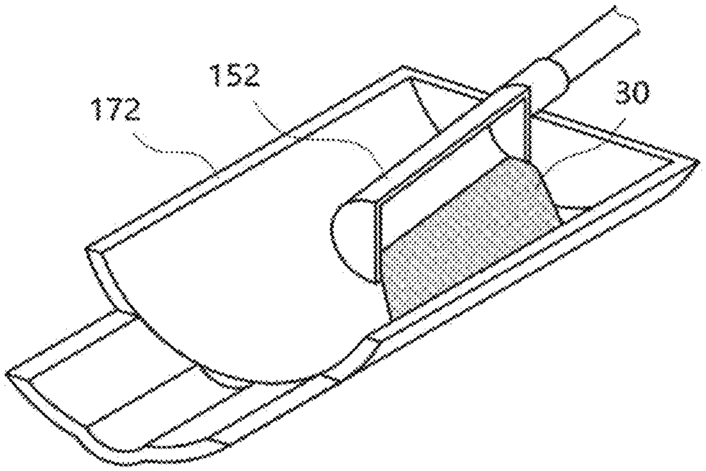
FIG. 9 is a view illustrating a process in which the second bucket is turned upside down to supply the silicon material of the second bucket to the preliminary crucible.

Accordingly, as illustrated in FIGS. 8 and 9, as the second bucket 152 is moved into the heating space 184 by the sliding unit 156 and rotated to be turned upside down by the second rotation unit 158, the solid-state silicon material 30 in the second bucket 152 may be supplied to the preliminary crucible 172.

Figure 10:
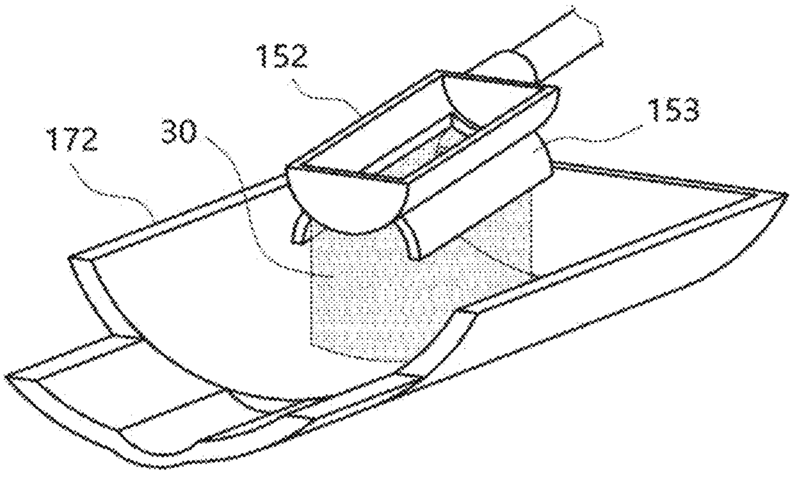
FIG. 10 is a view illustrating a state in which a lower surface of the second bucket is opened to supply the silicon material in the second bucket to the preliminary crucible.

Alternatively, as illustrated in FIG. 10, a lower surface 153 of the second bucket 152 is opened, and thus the solid silicon material 30 accommodated in the second bucket 152 may be supplied to the preliminary crucible 172.

Meanwhile, the continuous ingot growing apparatus 100 of the present embodiment may be divided into a high temperature zone H and a low temperature zone C.

The high temperature zone H may be a region in which the solidified silicon material 30 is melted and the ingot 10 is grown from the molten silicon 20, and the growth furnace 110 in which the main crucible 120 is provided and the preliminary melting unit 170 may be positioned in the high temperature zone H.

The low temperature zone C may be a region which is provided outside the high temperature zone H and in which the solid-state silicon material 30 is handled and may include the material supply unit 130 and the quantitative supply unit 140 which are for supplying the silicon material 30 into the high temperature zone H.

As described above, the inlet 186 through which the heating space 184 of the preliminary crucible heating module communicates with the quantitative supply housing 141 of the quantitative supply unit 140 may be formed between the preliminary crucible heating module and the quantitative supply housing 141. In addition, the second bucket 152 may enter so as to be above the preliminary crucible 172 of the heating space 184 through the inlet 186.

Meanwhile, a blocking plate 198 for opening and closing the inlet 186 may be installed in the inlet 186. The blocking plate 198 may be provided to open the inlet 186 only when the second bucket 152 enters the heating space 184 through the inlet 186, and otherwise, to close the inlet 186. In addition, the blocking plate 198 may be formed of a heat insulating material capable of blocking heat to block heat in the high temperature zone H from being transferred to the low temperature zone C.

In addition, when heat in the heating space 184 leaks to the outside of the preliminary melting unit 170, since more energy may be needed to heat the preliminary crucible 172, in order to block the heat in the heating space 184 from leaking to the outside of the preliminary melting unit 170, a one side heat insulating member 187 may be provided at a side of the opening 185 formed at one side of the heating space 184, and the other side heat insulating member 189 may be provided at the other side facing the quantitative supply unit 140 of the heating space 184.

In this case, the one side heat insulating member 187 provided at the side of the opening 185 formed at one side of the heating space 184 may extend downward from an upper side of the body 183 of the preliminary crucible heating module 182 so that supply of the molten silicon 20 in the preliminary crucible 172 is not interfered with in the cylindrical heating space 184 and the heat in the heating space 184 is blocked from leaking to the growth furnace 110, the other side heat insulating member 189 provided at the other side of the space 184 may be provided between the heating space 184 and the quantitative supply unit 140 in order to block the heat from leaking from the heating space 184 to the quantitative supply unit 140, and the inlet 186 may be formed in the other heat insulating member 189.

Since heat in the high temperature zone H is blocked from being transferred to the low temperature zone C, a temperature in the high temperature zone H can be maintained, and thus energy consumption can be reduced. In addition, since the heat in the high temperature zone H is blocked from being transferred to the low temperature zone C, the solid-state silicon material 30 can be prevented from being melted, fused, and stuck before being supplied to the high temperature zone H.

In addition, since the second bucket 152 is usually positioned in the low temperature zone C and enters the high temperature zone H only when the silicon material 30 is supplied to the preliminary crucible 172, the time for which the second bucket 152 is heated by heat in the high temperature zone H can be minimized, and thus a phenomenon in which the silicon material 30 is melted and fused to the second bucket 152 can be minimized.

Using the ingot growing apparatus, since the ingot 10 may be continuously grown in the main crucible 120, and the main crucible 120 may be continuously replenished with the molten silicon 20 by the preliminary melting unit 170 in an amount as much as an amount of molten silicon 20 consumed due to the growth of the ingot 10 in the main crucible 120, the level of the interface in the main crucible 120 can be constantly maintained, and thus the capacity of the main crucible 120 can be minimized to reduce the size of the apparatus, and the quality of the ingot 10 can also be uniformly maintained from the beginning to the end.

Meanwhile, one embodiment of a method of controlling the ingot growth device of the present invention will be described below.

Figure 11:
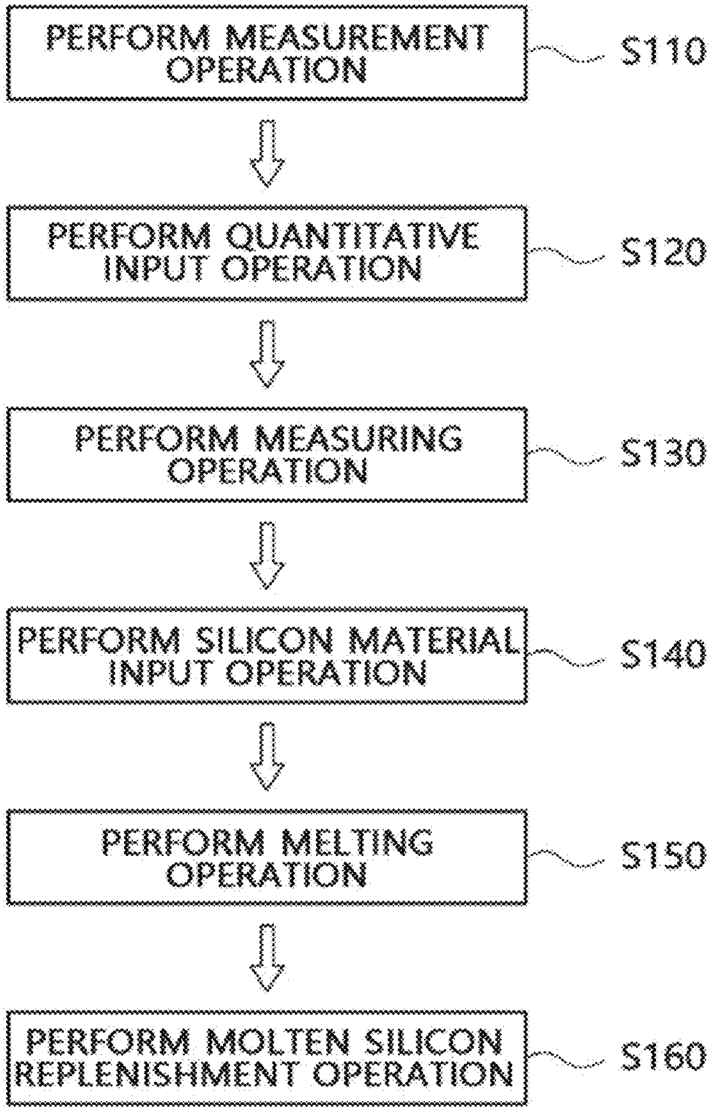
FIG. 11 is a flowchart illustrating a method of controlling a continuous ingot growing apparatus according to another embodiment of the present invention.

As illustrated in FIG. 11, the method of controlling the ingot growing apparatus according to the present embodiment may include a measurement operation S110, a silicon material input operation S140, a melting operation S150, and a molten silicon replenishment operation S160.

The measurement operation S110 is an operation of measuring an amount of consumed molten silicon 20 by measuring a level of an interface of the molten silicon in the main crucible 120. That is, as the ingot 10 grows, the molten silicon 20 in the main crucible 120 is consumed, and accordingly, the level of the interface of the molten silicon 20 in the main crucible 120 may be lowered. In this case, the level of the interface of the molten silicon 20 in the main crucible 120 may be detected using the interface level detection means 112 and the like to measure the amount of the consumed molten silicon 20.

After the amount of the consumed molten silicon 20 is measured in the measurement operation S110, a quantitative input operation S120 and a measuring operation S130 may be performed.

The quantitative input operation S120 is an operation of supplying a solid silicon material 30 to the quantitative supply unit 140. More specifically, the quantitative input operation S120 is an operation of suppling a solid silicon material stored in the material supply unit 130 to the first bucket 143 of the quantitative supply unit 140 through the material transfer module 134.

The measuring operation S130 is an operation of measuring an amount of the solid-state silicon material 30 supplied to the first bucket 143 by measuring a weight of the first bucket 143. The measuring operation S130 may be an operation of stopping supply of the solid silicon material 30 when a preset amount of the solid silicon material 30 is supplied to the first bucket 143 or continuously supplying the solid silicon material 30 when an amount of the solid silicon material 30 supplied to the first bucket 143 does not reach a set amount.

In the silicon material input operation S140, an amount of the solid silicon material 30 corresponding to the amount of the consumed molten silicon 20 measured in the measurement operation S110 may be supplied to the preliminary crucible 172 of the preliminary melting unit 170.

That is, the silicon material input operation S140 may be an operation in which the silicon material 30 supplied to the first bucket 143 is transferred to the second bucket 152 and the second bucket 152 transfers the solid-state silicon material 30 to the preliminary crucible 172 of the preliminary melting unit 170.

When the first bucket 143 transfers the solid-state silicon material 30 to the second bucket 152, the operating module 147 operates to turn the first bucket 143 upside down, and thus the silicon material 30 contained in the first bucket 143 may fall and be transferred to the second bucket 152 positioned under the first bucket 143.

After the silicon material 30 is transferred to the second bucket 152, the second bucket 152 may enter the heating space 184 of the preliminary crucible heating module by the sliding unit 156 of the transfer module 154. In this case, the blocking plate 198 may be opened to open the inlet 186, and the second bucket 152 having entered the heating space 184 may be positioned above the preliminary crucible 172. In addition, the second rotation unit 158 of the transfer module 154 operates to turn the second bucket 152 upside down, and thus the solid-state silicon material 30 accommodated in the second bucket 152 may be poured and transferred to the preliminary crucible 172. In addition, after the solid-state silicon material 30 is completely transferred, the second bucket 152 may return to an original position in the quantitative supply housing 141 by the transfer module 154, and after the second bucket 152 exits the preliminary melting unit 170, the blocking plate 198 closes the inlet 186 to block heat of the heating unit from being transferred to the low temperature zone C. In addition, in this case, the preliminary crucible 172 may be positioned at the first position so that the transferred solid-state silicon material 30 does not spill or overflow to the outside.

In the melting operation S150, the heater 188 of the preliminary crucible heating module may operate to heat the preliminary crucible 172 and the solid silicon material 30 accommodated in the preliminary crucible 172. In this case, in the melting operation S150, the preliminary crucible 172 and the silicon material 30 contained in the preliminary crucible 172 may be heated so that the solid silicon material 30 is completely melted. In addition, the preliminary crucible 172 may be positioned at the first position.

The melting operation S150 is an operation of heating the silicon material 30 supplied to the preliminary crucible 172 to completely liquefy the silicon material 30 into molten-state silicon 20. In the present operation, the preliminary melting unit 170 may heat the solid silicon material 30 supplied to the preliminary crucible 172 to be liquefied into the molten-state silicon 20 using the heater 188 of the preliminary crucible heating module. In this case, the preliminary crucible 172 may be at the first position.

The molten silicon replenishment operation S160 is an operation of supplying the molten silicon 20 melted in the preliminary crucible 172 in the melting operation S150 to the main crucible 120. In the molten silicon replenishment operation S160, the lifter 196 is moved upward to move the other side of the preliminary crucible 172 upward, and thus the preliminary crucible 172 may be positioned at the second position at which the open one side of the preliminary crucible 172 is tilted downward. Accordingly, the molten silicon 20 in the preliminary crucible 172 may flow down from the open one side of the preliminary crucible 172 to the main crucible 120 along a slope due to gravity. In addition, when the molten silicon 20 flows down to the main crucible 120, the molten silicon 20 may flow along an inclined surface of an inner circumferential surface of the main crucible 120 exposed upward from a liquid surface of the molten silicon 20 in the main crucible 120 to be added to the molten silicon 20 in the main crucible 120. Accordingly, the possibility that the molten silicon 20 splashes onto a surface of the growing ingot 10 during replenishment of the molten silicon 20 may be eliminated, and the liquid surface of the molten silicon 20 in the main crucible 120 may be constantly maintained. In addition, a phenomenon in which the preliminary crucible 172 is continuously heated by the heater 188 to solidify the molten silicon 20 in the preliminary crucible 172 while the molten silicon 20 is supplied to the main crucible 120 may be prevented.

According to the above configuration, in a continuous ingot growing apparatus and a method of controlling the same according to one embodiment of the present invention, since a silicon material, such as polysilicon, in a molten state, in which the silicon material is completely melted outside a main crucible in which an ingot is grown, is supplied to the main crucible, there is no need to form a partition in the main crucible, and thus the size of the main crucible can be reduced and manufacturing costs of an apparatus can be reduced. In addition, since the main crucible is formed with one zone, there is an effect of improving the ease of temperature control in the main crucible.

In addition, in a continuous ingot growing apparatus and a method of controlling the same according to an embodiment of the present invention, since a preliminary crucible of a preliminary melting unit is tilted to pour molten silicon in the preliminary crucible so as to supply the molten silicon to a main crucible, a component such as a separate pipe can be omitted, and a clogging phenomenon caused by fusion and solidification of the molten silicon can be fundamentally eliminated. Accordingly, since the apparatus can be continuously operated for a long time, productivity can be improved and the quality of a produced ingot can be uniform.

In addition, in the continuous ingot growing apparatus and the method of controlling the same according to the embodiment of the present invention, since the preliminary crucible can be always positioned and heated in a heating space of the preliminary melting unit even at a first position and a second position, there is an effect of suppressing the cooling of the preliminary crucible and solidification of the molten silicon.

In addition, in the continuous ingot growing apparatus and the method of controlling the same according to the embodiment of the present invention, since a quantitative supply unit for supplying a silicon material such as polysilicon to the preliminary melting unit is positioned in a low temperature zone disposed outside a high temperature zone, and a bucket containing solid silicon enters the high temperature zone only when necessary such as when the silicon material such as the polysilicon is supplied to the preliminary melting unit and is usually positioned in the low temperature zone, a phenomenon in which the bucket is heated and the silicon material is melted and sticks to the bucket can be fundamentally prevented. Accordingly, a maintenance cycle of the apparatus increases, and thus there is an effect of continuously operating the apparatus for a long time.

In addition, in a continuous ingot growing apparatus and a method of controlling the same according to an embodiment of the present invention, since molten silicon is completely melted outside a main crucible and then supplied to the main crucible, there is no need to separately melt the silicon in the main crucible, and thus there is an effect of reducing the time required for production.

While embodiments of the present invention have been described above, the spirit of the present invention is not limited to the embodiments proposed in this specification. Other embodiments may be easily suggested by adding, changing and removing components within the scope of the invention by those skilled in the art and will fall within the spirit and scope of the present invention.

What is claimed is:

1. A continuous ingot growing apparatus comprising:
   - a growth furnace in which a main crucible is positioned, wherein the main crucible accommodates molten-state silicon to grow an ingot;
   - a material supply unit which supplies a solid-state silicon material before being melted into the molten-state silicon;
   - a quantitative supply unit which measures an amount of the solid-state silicon material supplied from the material supply unit and supplies a predetermined amount of the solid-state silicon material; and
   - a preliminary melting unit which melts the predetermined amount of the solid-state silicon material supplied from the quantitative supply unit and supplies the molten-state silicon to the main crucible,
   - wherein the quantitative supply unit includes:
     - a first bucket which accommodates the solid-state silicon material supplied from the material supply unit;
     - a weight detection sensor provided to measure an amount of the solid-state silicon material accommodated in the first bucket; and
     - a quantitative supply housing having an inner space in which the first bucket is positioned,
   - wherein the solid-state silicon material is blocked from being supplied to the first bucket according to the amount of the solid-state silicon material accommodated in the first bucket.

2. The continuous ingot growing apparatus of claim 1, wherein the material supply unit includes:
   - a material storage housing which stores the solid-state silicon material; and
   - a material transfer module which supplies the solid-state silicon material stored in the material storage housing to the quantitative supply unit.

3. The continuous ingot growing apparatus of claim 1, comprising: a second bucket which is positioned in the quantitative supply housing and supplies the solid-state silicon material accommodated in the first bucket to the preliminary melting unit; and a transfer module provided in the quantitative supply housing to move the second bucket toward the preliminary melting unit.

4. The continuous ingot growing apparatus of claim 3, wherein:
   - each of the first bucket and the second bucket is formed in a container shape which is open upward;
   - the first bucket is positioned above the second bucket; and
   - the first bucket is configured to transfers the solid-state silicon material accommodated therein to the second bucket.

5. The continuous ingot growing apparatus of claim 4, wherein the first bucket is configured to rotate about an axis parallel to a bottom surface of the quantitative supply housing.

6. The continuous ingot growing apparatus of claim 4, wherein the first bucket has a lower surface configured to be openable and closable.

7. The continuous ingot growing apparatus of claim 3, wherein the preliminary melting unit includes:
   - a preliminary crucible which accommodates the solid-state silicon material; and
   - a preliminary crucible heating module including a body having a heating space in which the preliminary crucible is disposed to be heated and a heater installed in the body to heat the preliminary crucible,
   - wherein one side of the preliminary crucible heating module faces the main crucible, and the other side of the preliminary crucible heating module is formed to be spatially connected to one side of the quantitative supply housing so that the second bucket transferred by the transfer module enters the heating space.

8. The continuous ingot growing apparatus of claim 7, wherein a blocking plate, which is opened and closed, is installed between the preliminary crucible heating module and the quantitative supply housing.

9. The continuous ingot growing apparatus of claim 7, wherein an opening is formed at one side of the preliminary crucible heating module in a direction toward the main crucible.

10. The continuous ingot growing apparatus of claim 9, further comprising a heat insulating member provided on at least any one of an open one side of the heating space and the other side at which the preliminary crucible heating module is spatially connected to the quantitative supply housing in order to block heat in the heating space from leaking.

11. The continuous ingot growing apparatus of claim 9, wherein:

the preliminary crucible is formed in a container shape which is open upward; and an open side surface is formed at one side of the preliminary crucible facing the main crucible.

12. The continuous ingot growing apparatus of claim 11, wherein:

the heating space of the body forms a cross section of a closed curved shape; and a central axis of the heating space is formed to be tilted with respect to a bottom surface.

13. The continuous ingot growing apparatus of claim 12, wherein, in a state in which the second bucket is positioned in the heating space, the preliminary crucible is positioned under the second bucket.

14. The continuous ingot growing apparatus of claim 13, comprising a preliminary crucible moving module which moves the preliminary crucible in the heating space, wherein the preliminary crucible is moved between a first position, at which the solid-state silicon material accommodated in the second bucket is accommodated in the preliminary crucible and then melted by the heater, and a second position, at which the molten-state silicon is supplied to the main crucible, by the preliminary crucible moving module.

15. The continuous ingot growing apparatus of claim 14, wherein:

at the first position, the preliminary crucible is tilted so that the open side surface of the preliminary crucible faces upward;

at the second position, the preliminary crucible is tilted so that the open side surface of the preliminary crucible faces downward; and the molten-state silicon in the preliminary crucible flows out toward the main crucible in a state in which the preliminary crucible is positioned at the second position.

16. The continuous ingot growing apparatus of claim 14, wherein, in a state in which one side of the preliminary crucible is rotatably fixed, the other side of the preliminary crucible is vertically moved by the preliminary crucible moving module.

* * * * *